United States Patent [19]

Ichimaru

[11] Patent Number: 5,546,053

[45] Date of Patent: Aug. 13, 1996

[54] PHASE LOCKED LOOP HAVING BOOSTER CIRCUIT FOR RAPID LOCKUP

[75] Inventor: Kouzou Ichimaru, Higashikunisaki-gun, Japan

[73] Assignee: Texas Instruments Incorporated, Dallas, Tex.

[21] Appl. No.: 427,466

[22] Filed: Apr. 24, 1995

Related U.S. Application Data

[63] Continuation of Ser. No. 281,049, Jul. 27, 1994, abandoned.

[51] Int. Cl.$^6$ .................................................. H03L 7/093
[52] U.S. Cl. ............................. 331/11; 331/17; 331/25
[58] Field of Search ............................. 331/10, 11, 16, 331/17, 25

[56] References Cited

U.S. PATENT DOCUMENTS 4,562,411  12/1985  O'Rourke et al. ................. 331/17 X
5,170,130  12/1992  Ichihara ............................ 331/17 X

*Primary Examiner*—Siegfried H. Grimm
*Attorney, Agent, or Firm*—William E. Hiller; Richard L. Donaldson

[57] ABSTRACT

A frequency adjusting circuit having a voltage-controlled oscillator in which the lockup time is shortened. The voltage waveform appearing at the two terminals of a resistor element $R_1$ of a low-pass filter 6 is subject to voltage/current conversion by a voltage/current converter VIC. The charge is stored in capacitor $C_3$. The voltage generated in capacitor $C_3$ is input to comparator CMP1 or CMP2. If the voltage generated is higher than a prescribed level, switching elements SW1 and SW2 close. In the same direction as that of the current flowing in capacitor $C_2$ through resistor element $R_1$, a charge proportional to the amount of the charge through $R_1$ flows to capacitor $C_2$ and is stored in it. In this way, only in the unlocked state of the voltage-controlled oscillator 1 when the pulse (charge) output as fed back to the voltage-controlled oscillator 1 from phase comparator 5 is large, a booster circuit 7 is operated, and it is possible to undergo transition to the locked state of the voltage-controlled oscillator 1 rapidly.

6 Claims, 2 Drawing Sheets

PHASE LOCKED LOOP HAVING BOOSTER CIRCUIT FOR RAPID LOCKUP

This application is a continuation of U.S. patent application Ser. No. 08/281,049, filed Jul. 27, 1994, now abandoned.

This invention concerns a type of PLL (phase-locked loop) circuit or other frequency adjusting circuit used in the communications field, etc.

BACKGROUND OF THE INVENTION

FIG. 4 is a block diagram illustrating a conventional PLL frequency synthesizer. In FIG. 4, the frequency synthesizer comprises a voltage-controlled oscillator 1 (referred to as VCO hereinafter) with an oscillation frequency of $f_1$; a frequency divider 2 with a frequency dividing ratio of N1; a reference oscillator 3 with a frequency of $f_2$; a frequency divider 4 with a frequency dividing ratio of N2; a phase comparator 5; and a low-pass filter 6 (referred to as LPF hereinafter).

In this configuration, signal $S_1$ at a frequency of $f_1$ output from VCO 1 is subject to processing of frequency dividing (1/N1) by frequency divider 2, and signal $S_2$ formed is input to phase comparator 5.

On the other hand, signal $S_3$ at a frequency of $f_2$ output from reference oscillator 3 is subject to processing of frequency dividing (1/N2) by frequency divider 4, and signal $S_4$ formed is input to phase comparator 5.

At phase comparator 5, phase comparison with signal $S_2$ with reference to input signal $S_4$ is performed. The output of phase comparator 5 is made of an AC component and a DC component (the error output current), and it is output to LPF 6.

For the DC component in phase comparator 5, the polarity (positive/negative) and the magnitude vary depending on whether the phase of signal $S_2$ leads or lags signal $S_4$.

In LPF 6, the AC component is removed from the output of phase comparator 5, and only the DC component is extracted and fed back to VCO 1.

In this way, the center frequency of output signal $S_1$ of VCO 1 always follows the phase of output signal $S_3$ of reference oscillator 3, and, with the following relationship, VCO 1 oscillates at frequency $f_2$ in the so-called locked state.

$$f_1/N1 = f_2/N2.$$

Also, the value of $f_2$ can be changed at will in steps of $(f_2/N2)$ by changing frequency dividing ratio N1 of frequency divider 2.

However, in the aforementioned circuit, immediately after the power source is turned on and the circuit is established, and when frequency dividing ratio N1 of frequency divider 2 is changed, the system exits from the locked state (enters the unlocked state), and only the DC component from LPF 6 is fed back to VCO 1. After a little while, VCO 1 reenters the locked state.

The time needed for transition from the unlocked state to the locked state (the lockup time) depends on capacitor $C_1$ (such as 500 pF), capacitor $C_2$ (such as 0.2 μF), and resistor $R_1$ (such as 10 Ω) that form LPF 6. For the aforementioned circuit, it is difficult to shorten the lockup time because of the need for maintaining a stable locked state.

In particular, the time needed for charging capacitor $C_2$, which has a large capacitance, is also a factor.

It is an object of this invention to provide a frequency adjusting circuit in which the lockup time of the voltage-controlled oscillator component can be shortened.

SUMMARY OF THE INVENTION

In accordance with the invention, a frequency adjusting circuit is provided in which the frequency is adjusted as the oscillation frequency of a voltage-controlled oscillator is made to follow the frequency of a reference signal. The frequency adjusting circuit comprises: a phase comparator which detects the phase difference between the output signal of the voltage-controlled oscillator and the reference signal; a filter which contains a first capacitor connected between the output of the phase comparator and the reference potential, a resistor element having one terminal connected to the output of the phase comparator, and a second capacitor connected between the other terminal of the resistor element and the reference potential, and which feeds back a DC component to the voltage-controlled oscillator corresponding to the output signal of the phase comparator; and a booster circuit which derives the integration value of the voltage waveform on the two terminals of the resistor element, and stores in the second capacitor a charge proportional to the integration value.

According to the invention, for example, right after the circuit is turned on, in the phase comparator, phase comparison is performed for the output signal of the voltage-controlled oscillator with reference to the reference signal; the signal containing the error output current as the DC component is output to the filter.

In the phase comparator, the value of the DC component has its polarity (positive/negative) and magnitude depending on whether the phase of the voltage-controlled oscillator leads or lags the reference signal.

In the filter, from the output of the phase comparator, only the DC component is extracted and it is fed back to the voltage-controlled oscillator.

In this case, the input error output current is stored in the first capacitor. The charge is then transferred to the second capacitor with a time constant depending on the capacitance of the first capacitor and the resistance of the resistor element.

In this case, the prescribed voltage waveform is displayed on the two terminals of the resistor element.

The voltage waveform displayed on the two terminals of the resistor element of the filter is input to the booster circuit, and its integration value is derived. Corresponding to this integration value, the charge is stored in the second capacitor.

In this way, the second capacitor can be charged rapidly. Consequently, for the voltage-controlled oscillator, transition from the unlocked state to the locked state occurs rapidly.

Figure 1:
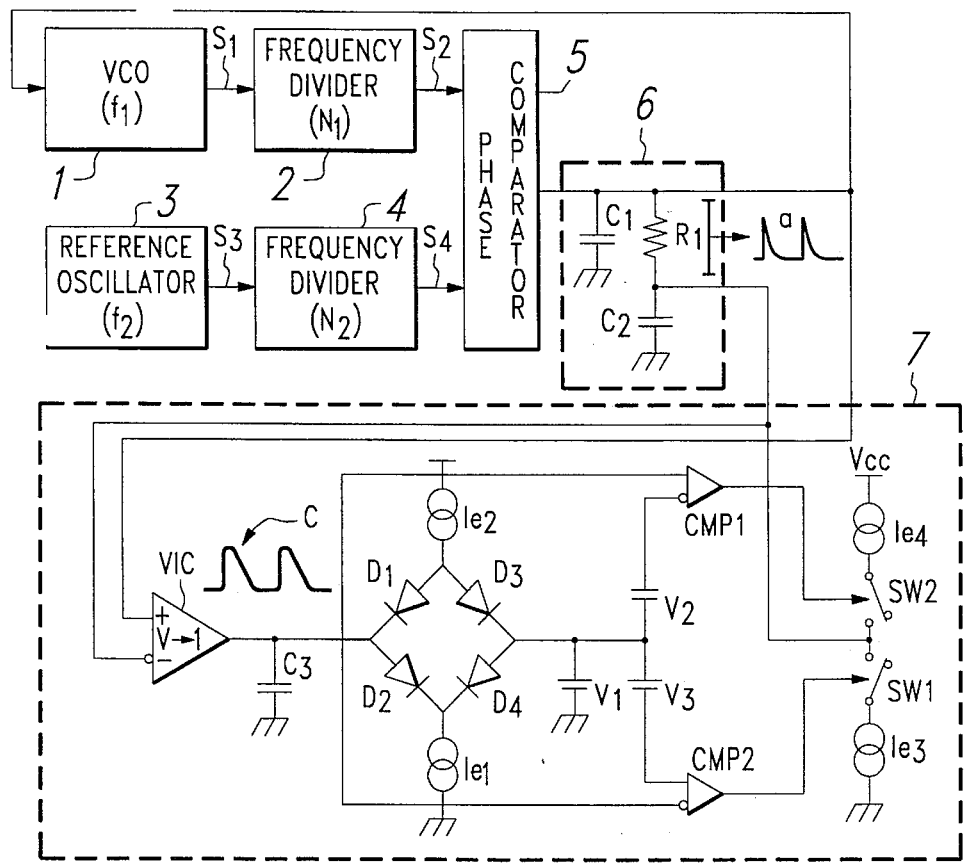
FIG. 1 is a block diagram illustrating an embodiment of a PLL frequency synthesizer as a frequency adjusting circuit in accordance with the invention.

Reference numerals as shown in the drawings:
1, VCO
2,4, frequency divider
3, reference oscillator
5, phase comparator
6, LPF
   $R_1$, resistor element
   $C_1$, $C_2$, capacitor
7, booster circuit
   VIC, voltage/current converter
   CMP1, CMP2, comparator
   DB, diode bridge
   SW1, SW2, switching element
   $C_3$, capacitor
   $I_{e1}$–$I_{e4}$, constant-current source
   $V_1$–$V_3$, constant-voltage source

DESCRIPTION OF PREFERRED EMBODIMENT

Figure 4:
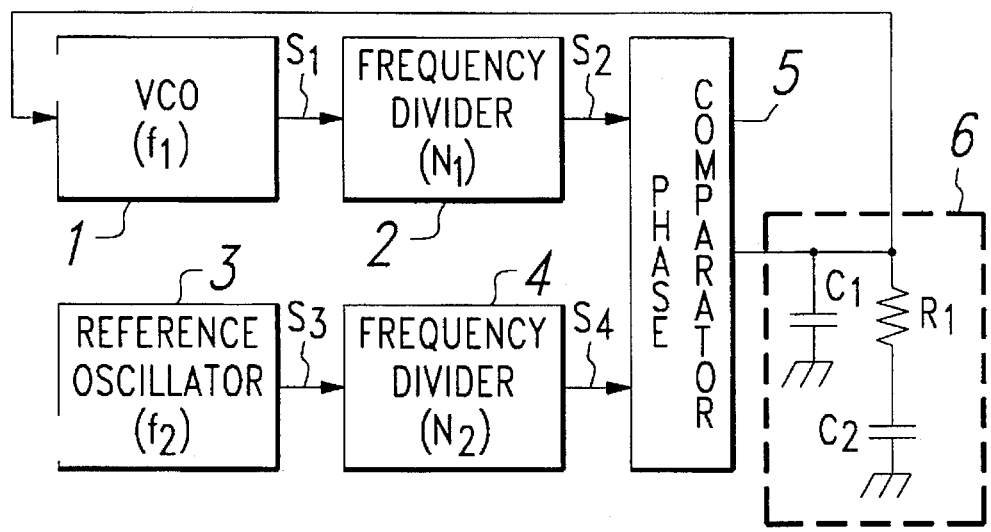
FIG. 4 is a block diagram illustrating a conventional PLL frequency synthesizer as a conventional frequency adjusting circuit.

FIG. 1 is a block diagram illustrating an embodiment of a PLL frequency synthesizer used as a frequency adjusting circuit in accordance with the invention. FIG. 1 employs the same reference numerals as those shown in FIG. 4 to designate the same parts.

Thus, the PLL frequency synthesizer of FIG. 1 comprises a VCO 1; a frequency divider 2 with a frequency dividing ratio of N1; a reference oscillator 3 with an oscillation frequency of $f_2$; a frequency divider 4 with a frequency dividing ratio of $N_2$; a phase comparator 5; an LPF 6; and a booster circuit 7.

Booster circuit 7 comprises voltage/current converter VIC, comparators CMP1 and CMP2, diode bridge DB, switching elements SW1 and SW2, capacitor $C_3$, constant-current sources $I_{e1}$–$I_{e4}$, and constant-voltage sources $V_1$–$V_3$.

One input (+) of voltage/current converter VIC is connected to the connection point between one terminal of resistor element $R_1$ of LPF 6 and the input terminal of VCO 1. Its other input (−) is connected to the connection point between the other terminal of the resistor element $R_1$ of LPF 6 and capacitor $C_2$.

The output of voltage/current converter VIC is connected to the connection middle point between the cathode of diode $D_1$ of diode bridge DB and the anode of diode $D_2$ of said bridge, and it is connected to the noninverting input of comparator CMP1 and the inverting input of comparator CMP2. Also, capacitor $C_3$ is connected between the output of voltage/current converter VIC and ground.

The connection point between the anode of diode $D_1$ of diode bridge DB and the anode of diode $D_3$ of the diode bridge is connected to one terminal of constant-current source $I_{e2}$; and the other terminal of constant-current source $I_{e2}$ is connected to power source voltage $V_{cc}$.

The connection point between the cathode of diode $D_2$ of diode bridge DB and the cathode of diode $D_4$ of the diode bridge is connected to one terminal of constant-current source $I_{e1}$; and the other terminal of constant-current source $I_{e1}$ is connected to ground.

The connection point between the cathode of diode $D_3$ of diode bridge DB and the anode of diode $D_4$ of the diode bridge is connected through constant-voltage source $V_2$ to the inverting input of comparator CMP1, and it is connected to the noninverting input of comparator CMP2 through constant-voltage source $V_3$. The connection point between the cathode of diode $D_3$ and the anode of diode $D_4$ is connected to constant-voltage source $V_1$.

The output of comparator CMP1 is connected to the control terminal of switching element SW2, and the output of comparator CMP2 is connected to the control terminal of switching element SW1.

The output contacts of switching elements SW1 and SW2 are connected to each other. Their connection point is connected to the connection middle point between the other terminal of resistor element $R_1$ of LPF 6 and capacitor $C_2$.

The pole of switching element SW1 is connected to one terminal of constant-current source $I_{e3}$; and the other terminal of constant-current source $I_{e4}$ is connected to ground.

The pole of switching element SW2 is connected to one terminal of constant-current source $I_{e4}$; and the other terminal of constant-current source $I_{e4}$ is connected to power source voltage $V_{cc}$.

Also, a current of, say, 60 μA, is fed to constant-current sources $I_{e3}$ and $I_{e4}$.

In the following, the operation of the aforementioned configuration will be explained.

For example, immediately after the circuit is established, signal $S_1$ with frequency $f_1$ output from VCO 1 has its frequency divided to (1/N1) by frequency divider 2, and signal $S_2$ provided at the output of frequency divider 2 is input to phase comparator 5.

On the other hand, signal $S_3$ with frequency $f_2$ output from reference oscillator 3 has its frequency divided to (1/N2) by frequency divider 4, and signal $S_4$ provided at the output of frequency divider 4 is input to phase comparator 5.

In phase comparator 5, phase comparison is performed with signal $S_2$ with reference to input signal $S_4$, and the error output current as the DC component is output to LPF 6.

The polarity (positive/negative) and the magnitude of the value of the DC component in phase comparator 5 vary depending on whether the phase of signal $S_2$ leads or lags signal $S_4$.

In LPF 6, the AC component is removed from the output of phase comparator 5, and only the DC component is extracted and fed back to VCO 1.

In this way, the central frequency of output signal $S_1$ of VCO 1 always follows the phase of output signal $S_3$ of reference oscillator 3 due to the function of booster circuit 7 to be presented later, and VCO 1 rapidly enters the locked state.

That is, in LPF 6, the input error output current is stored in capacitor $C_1$. With a time constant of ($R_{1v} \cdot C_{1v}$), the charge is transferred to capacitor $C_2$.

Here, $R_{1v}$ represents the resistance of resistor element $R_1$, and $C_{1v}$ represents the capacitance of capacitor $C_1$.

In this case, the voltage waveform represented by a in FIG. 1 is displayed on the two terminals of resistor element $R_1$.

By means of voltage/current converter VIC of booster circuit 7, this voltage signal a is converted from a voltage to a current, which is then stored in capacitor $C_3$.

The voltage generated at capacitor $C_3$ is applied to the noninverting input of comparator CMP1 and the inverting input of comparator CMP2. Also, the voltage causes current to flow through diode bridge DB, and it is fed through constant-voltage sources $V_1$–$V_2$ to the inverting input of comparator CMP1 and the noninverting input of comparator CMP2.

As the potential of capacitor $C_3$ makes current flow through the diode bridge DB, it soon returns to the original potential with the waveform represented by c shown in FIG. 1.

During the period of time from voltage generation of capacitor $C_3$ to resetting to the original level, either the output of comparator CMP1 or CMP2 goes high, and the signal is output to the control terminal of switching element SW2 or SW1.

More specifically, when the output pulse (charge) of phase comparator 5 is higher on the positive side than that in the conventional locked state, the output of comparator CMP1 goes high, and switching element SW2 closes.

On the other hand, when the output pulse (charge) of phase comparator (5) becomes larger on the negative side than that in the conventional locked state, the output of comparator CMP2 goes high, and switching element SW1 closes.

That is, when the voltage generated at capacitor $C_3$ goes higher than a prescribed level, either switching element SW1 or SW2 closes the current from constant-current sources $I_{e4}$ and $I_{e3}$ flows through switching elements SW1 or SW2 to capacitor $C_2$ of LPF 6, in the same direction as the direction of flow through resistor element $R_1$, and the circuit rapidly enters the locked state.

Also, as either switching element SW1 or SW2 is maintained on during the period of resetting of the potential of capacitor $C_3$ to the original potential, the amount of the charge flowing through switch SW1 or SW2 is proportional to the amount of the charge through resistor element $R_1$.

Figure 2:
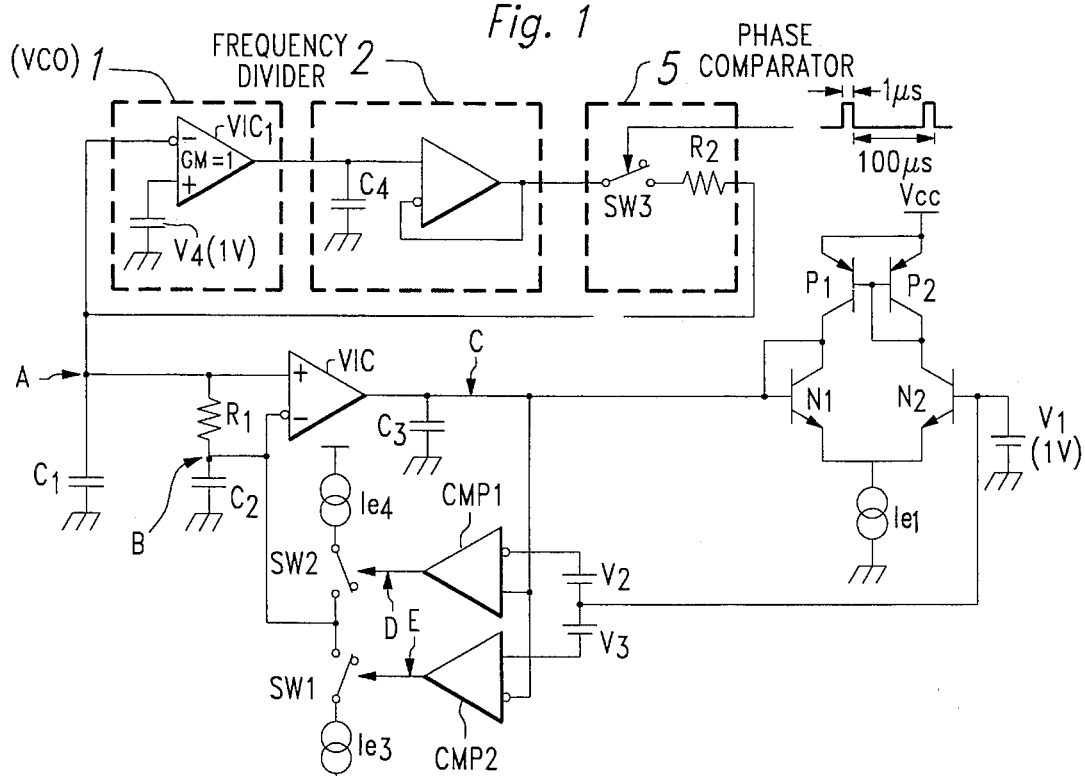
FIG. 2 is a circuit diagram illustrating a circuit for simulation which is equivalent to the frequency adjusting circuit of FIG. 1.

In the practical case, simulation was performed by means of the equivalent circuit shown in FIG. 2.

In the circuit shown in FIG. 2, the frequency of VCO 1 corresponds to the output current of voltage/current converter $VIC_1$; frequency divider 2 integrates the output current of voltage/current converter $VIC_1$ through capacitor $C_4$, and phase comparator 5 outputs the error as charge from switching element SW3 and resistor element $R_2$.

Except for VCO 1, frequency divider 2 and phase comparator 5, the entire circuit is designed using practical transistors. For example, the circuit equivalent to the diode bridge is composed of pnp bipolar transistors P1, P2, and npn bipolar transistors N1 and N2.

Figure 3:
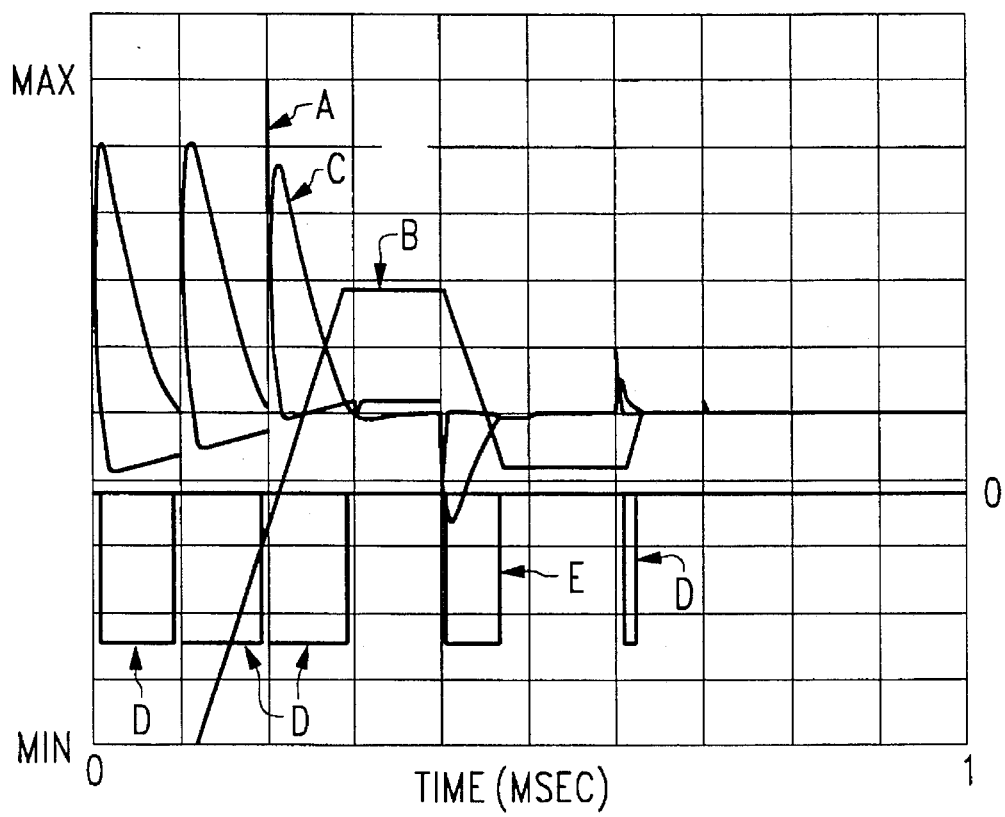
FIG. 3 is a graph illustrating simulation results using the circuit shown in FIG. 2.

FIG. 3 is a graph illustrating the results of simulation for the circuit shown in FIG. 2. The abscissa represents time (msec), and the ordinate represents the level.

In this figure, curve A represents the waveform at the node between capacitor $C_1$ and resistor element $R_1$ in the circuit shown in FIG. 2; curve B represents the waveform at the node between resistor element $R_1$ and capacitor $C_2$; curve C represents the waveform at the middle point of connection between output of voltage/current converter VIC and capacitor $C_3$; D represents the output waveform of comparator CMP1; and E represents the output waveform of comparator CMP2.

The levels of the various waveforms are different. FIG. 3 summarizes the relative levels for ease of understanding.

As can be seen from FIG. 3, for the circuit of this invention, when the phase comparison reference frequency is 10 kHz, at the time about 1 msec after rise, the waveform at point A rapidly nears the converging point, and it rapidly undergoes transition to the locked state.

In addition, the configuration ensures that constant-current sources $I_{e3}$ and $I_{e4}$ change due to the signal at point C, so that it is able to have point A approach the converging point in a stable manner.

As explained above, in this embodiment, the voltage waveform appearing on the two terminals of resistor element $R_1$ of LPF 6 is subject to voltage/current conversion by voltage/current converter VIC; the charge is stored in capacitor $C_3$. The voltage generated in capacitor $C_3$ is input to comparator CMP1 or CMP2. When the voltage generated is higher than a prescribed level, switching elements SW1 and SW2 become on. Then, in the same direction as the current flows through resistor element $R_1$ to capacitor $C_2$, charge proportional to the amount of the charge passing through $R_1$ flows to capacitor $C_2$ and is stored there. Consequently, only in the unlocked state of the VCO 1 when the pulse (charge) output from phase comparator 5 is high, the booster circuit 7 is operated, and it is possible to undergo transition to the locked state of the VCO 1 rapidly.

Consequently, the lockup time of the VCO 1 can be shortened, and communication equipment with good response can be realized. This is an advantage.

As explained above, according to this invention, it is possible to shorten the lockup time of the VCO 1 for transition from the unlocked state right after rise of the circuit to the locked state.

I claim:

1. A frequency adjusting circuit for adjusting the oscillation frequency of a voltage-controlled oscillator in accordance with a reference frequency signal, said frequency adjusting circuit comprising:

a phase comparator having first and second inputs for respectively receiving an output frequency signal of the voltage-controlled oscillator and the reference frequency signal and detecting the phase difference therebetween;

filter means having first and second capacitors, the first capacitor of said filter means being connected between the output of said phase comparator and a reference potential, a resistor having one terminal connected to the output of said phase comparator and the other terminal connected to said second capacitor, and said second capacitor being connected between the other terminal of said resistor and the reference potential, and said filter means being connectable to the input of the voltage-controlled oscillator via a feedback line from the output of said filter means to feedback a DC component signal corresponding to the output signal of said phase comparator; and a booster circuit interconnected between said resistor and said second capacitor for deriving the integration value of the voltage waveform at the two terminals of said resistor and storing a charge proportional to the integration value in said second capacitor.

2. A frequency adjusting circuit as set forth in claim 1, wherein said booster circuit includes a voltage/current converter having first and second inputs respectively connected to the connection point between one terminal of said resistor of said filter means and the input of the voltage/controlled oscillator and the other input connected to the connection point between the other terminal of said resistor and said second capacitor;

first and second comparators having respective inverting and noninverting inputs;

a diode bridge having an input for receiving the output of said voltage/current converter and an output respectively connected to the inverting input of said first comparator and the noninverting input of said second comparator;

the output of said voltage/current converter being respectively connected to the noninverting input of said first comparator and the inverting input of said second comparator;

a pair of constant current sources, one of said pair of constant current sources having a terminal connected to a power source voltage and the other of said constant current sources having a terminal connected to ground;

first and second switches having respective poles, output contacts, and control terminals and being connected between the respective other terminals of the corresponding one of said pair of constant current sources with the output contacts of said first and second switches being connected to each other;

a node in the connection between the output contacts of said first and second switches being connected to the connection point between the other terminal of said resistor and said second capacitor in interconnecting said booster circuit between said resistor and said second capacitor;

the outputs of said first and second comparators being respectively connected to the control terminal of the one of said first and second switches corresponding thereto; and the pole of one of said first and second switches contacting the output contact thereof to close said one of said first and second switches in response to an output from the corresponding one of said first and second comparators to the respective control terminal of said one of said first and second switches.

3. A frequency adjusting circuit as set forth in claim 2, wherein said booster circuit further includes a second pair of constant current sources respectively connected to diametrically opposed connection points of said diode bridge at one terminal thereof; and the other terminal of one of said second pair of constant current sources being connected to the power source voltage, and the other terminal of the other of said second pair of constant current sources being connected to ground.

4. A phase locked loop frequency synthesizer circuit comprising:

a voltage-controlled oscillator having an input and an output;

a reference frequency oscillator having an output providing a reference frequency signal;

a frequency adjusting circuit for adjusting the oscillation frequency output of said voltage-controlled oscillator in accordance with the output reference frequency signal from said reference frequency oscillator, said frequency adjusting circuit including a phase comparator having first and second inputs for respectively receiving the outputs from said voltage-controlled oscillator and said reference frequency oscillator and detecting the phase difference between the output signal of said voltage-controlled oscillator and the output signal of said reference frequency oscillator, filter means connected to the output of said phase comparator and including first and second capacitors and a resistor, the first capacitor of said filter means being connected between the output of said phase comparator and a reference potential, said resistor having one terminal connected to the output of said phase comparator and the other terminal connected to said second capacitor, said second capacitor being connected between the other terminal of said resistor and the reference potential, said filter means being connected via a feedback line from the output of said filter means to the input of said voltage-controlled oscillator so as to provide an output feeding back a DC component signal to said voltage-controlled oscillator corresponding to the output signal of said phase comparator, and a booster circuit connected across the two terminals of said resistor for deriving the integration value of the voltage waveform at the two terminals of said resistor and storing a charge proportional to the integration value in said second capacitor.

5. A frequency synthesizer circuit as set forth in claim 4, wherein said booster circuit includes a voltage/current converter having first and second inputs respectively connected to the connection point between one terminal of said resistor of said filter means and the input of said voltage/controlled oscillator and the other input connected to the connection point between the other terminal of said resistor and said second capacitor;

first and second comparators having respective inverting and noninverting inputs;

a diode bridge having an input for receiving the output of said voltage/current converter and an output respectively connected to the inverting input of said first comparator and the noninverting input of said second comparator;

the output of said voltage/current converter being respectively connected to the noninverting input of said first comparator and the inverting input of said second comparator;

a pair of constant current sources, one of said pair of constant current sources having a terminal connected to a power source voltage and the other of said constant current sources having a terminal connected to ground;

first and second switches having respective poles, output contacts, and control terminals and being connected between the respective other terminals of the corresponding one of said pair of constant current sources with the output contacts of said first and second switches being connected to each other;

a node in the connection between the output contacts of said first and second switches being connected to the connection point between the other terminal of said resistor and said second capacitor in interconnecting said booster circuit between said resistor and said second capacitor;

the outputs of said first and second comparators being respectively connected to the control terminal of the one of said first and second switches corresponding thereto; and the pole of one of said first and second switches contacting the output contact thereof to close said one of said first and second switches in response to an output from the corresponding one of said first and second comparators to the respective control terminal of said one of said first and second switches.

6. A frequency synthesizer circuit as set forth in claim 5, wherein said booster circuit further includes a second pair of constant current sources respectively connected to diametrically opposed connection points of said diode bridge at one terminal thereof; and the other terminal of one of said second pair of constant current sources being connected to the power source voltage, and the other terminal of the other of said second pair of constant current sources being connected to ground.

* * * * *